(12) United States Patent
Wu et al.

(10) Patent No.: US 9,244,115 B1
(45) Date of Patent: Jan. 26, 2016

(54) TEST ENGINE FOR INTEGRATED CIRCUIT CHIP TESTING

(71) Applicant: Marvell International Ltd., Hamilton (BM)

(72) Inventors: Albert Wu, Palo Alto, CA (US); Bruce Wang, Cupertino, CA (US); Abdul Elaydi, Santa Clara, CA (US); Chiping Ai, Santa Clara, CA (US); Hungchi Chen, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 441 days.

(21) Appl. No.: 13/709,851

(22) Filed: Dec. 10, 2012

Related U.S. Application Data

(63) Continuation of application No. 12/352,439, filed on Jan. 12, 2009, now Pat. No. 8,330,477.

(60) Provisional application No. 61/021,741, filed on Jan. 17, 2008.

(51) Int. Cl.
*G01R 31/00* (2006.01)
*G01R 31/20* (2006.01)
*G01R 31/26* (2014.01)
*G06F 15/00* (2006.01)
*H01L 23/544* (2006.01)

(52) U.S. Cl.
CPC ............ *G01R 31/2601* (2013.01); *G06F 15/00* (2013.01); *H01L 23/544* (2013.01)

(58) Field of Classification Search
None
See application file for complete search history.

(56) References Cited

U.S. PATENT DOCUMENTS

| | | | |
|---|---|---|---|
| 6,373,758 B1 | 4/2002 | Hughes et al. | |
| 7,053,470 B1 | 5/2006 | Sellers et al. | |
| 7,308,623 B2 | 12/2007 | Slobodnik et al. | |
| 7,458,000 B2 | 11/2008 | Gorman et al. | |
| 7,859,284 B2 | 12/2010 | Ikeda | |
| 8,330,477 B1* | 12/2012 | Wu et al. | 324/750.3 |
| 2002/0104051 A1 | 8/2002 | Gupta | |
| 2004/0100296 A1 | 5/2004 | Ong | |
| 2005/0086564 A1 | 4/2005 | Frankowsky et al. | |
| 2007/0106923 A1 | 5/2007 | Aitken et al. | |
| 2007/0232240 A1 | 10/2007 | Wu et al. | |

* cited by examiner

*Primary Examiner* — Jermele M Hollington

(57) ABSTRACT

Some of the embodiments of the present disclosure provide an integrated circuit (IC) chip comprising a die, a system on chip (SOC) coupled to the die, and an internal test engine included in the SOC and configured to test the die, wherein one or more components within the IC chip may be configured to be tested by an external test engine coupled to the IC chip. Other embodiments are also described and claimed.

21 Claims, 5 Drawing Sheets

KGD Commands

| DDR CMD | RSVD | Loop Control | RSVD | Address Control |
|---|---|---|---|---|

Loop Command
RD_pp : Read   data / data
RD_pn : Read   data / datab
RD_np : Read   datab/ data
RD_nn : Read   datab/ datab
WR_pp : Write  data / data
WR_pn : Write  data / datab
WR_np : Write  datab/ data
WR_nn : Write  datab/ datab
NOP: NOP
ACT : Activate Bank
PRE : Precharge
PREA: Precharge All
AR  : Auto Refresh Loop Control
[5] SB : Start of Bank
[4] EB : End of Bank
[3] SR : Start of Row
[2] ER : End of Row
[1] SC : Start of Column
[0] EC : End of Column Address Control
[3] INCR :1: Increment
        0: Decrement
[2] BU : Bank Update
[1] RU : Row Update
[0] CU : Column Update

General Command Format

| MRS/ Load Reg | RSVD | MRS/ Reg Number | L/Sb | RSVD |
|---|---|---|---|---|

MRS Number
000 : MR
001 : EMR1
010 : EMR2
011 : EMR3
100 : LOOP_CTRL
Default: RSVD L/Sb:
0 : Send MR / EMR
1 : Load MR / EMR / REG from next instruction

| REPEAT | RSVD | Flip | Jump Back | Repeat Count |
|---|---|---|---|---|

Flip:
Flip the background data pattern for each iteration

Jump Back
Jump to nth instruction before current PC
If this number is 0, it will jump to the beginning Repeat Count
Execute the whole program for 2^(Repeat_Count) times.
The repeat command ends when the command has been repeated 2^(Repeat_Count) times.

Fig. 3

TEST ENGINE FOR INTEGRATED CIRCUIT CHIP TESTING

CROSS REFERENCE TO RELATED APPLICATIONS

The present disclosure is a continuation of and claims priority to U.S. patent application Ser. No. 12/352,439, filed Jan. 12, 2009, now U.S. Pat. No. 8,330,477, issued Dec. 11, 2012, which is a Nonprovisional of and claims priority to U.S. Provisional Patent Application No. 61/021,741 filed Jan. 17, 2008, which are incorporated herein by reference.

TECHNICAL FIELD

Embodiments of the present disclosure relate to the field of integrated circuit devices, and more particularly, to test engines for integrated circuit chip testing.

BACKGROUND

Increasingly, integrated circuits (IC) are becoming more powerful, with more functionality included in an IC chip. For example, a system on chip (SOC) may integrate numerous components of a computing system into a single integrated circuit chip and may include digital, analog, mixed-signal, and often radio-frequency functions in a single chip. Similarly, a multi-chip module (MCM) is a specialized electronic package where multiple bare unpackaged integrated circuits (ICs) (e.g., bare dies), semiconductor dies or other modules are packaged in such a way as to facilitate their use as a single IC. Similar to an MCM, a system-in-a-package or system in package (SiP) encloses a number of bare unpackaged ICs in a single package or module. In some cases, in an SiP, dies may be stacked vertically, unlike a slightly less dense MCM, which may place dies horizontally alongside one another.

A SiP or MCM may perform all or most of the functions of an electronic system, may be used inside a number of electronic devices, e.g., a mobile phone, digital music player, etc., and may provide a high density module that requires less space on the motherboard of a device. An exemplary SiP or MCM may contain several chips (e.g., a specialized processor, an SOC, a DRAM, a flash memory, etc.), combined with one or more passive components (e.g., resistors and capacitors), all mounted on the same substrate. Thus, a complete functional unit can be built in the SiP or the MCM so that the SiP or the MCM may not need a relatively large number of external components to function.

FIG. 1 illustrates an IC chip 10 that includes a plurality of unpackaged integrated circuits (e.g., bare dies), semiconductor dies and/or other modules. In various embodiments, the IC chip 10 may be an SiP or an MCM. The IC chip 10 may include a SOC 18 and a die 32. The SOC 18 and the die 32 may be used for a variety of purposes based on the applicability of the IC chip 10. The IC chip 10 may also include a plurality of general purpose input/output (I/O) pins 38.

In various embodiments, the SOC 18 may include a plurality of components, as is known to those skilled in the art. For example, the SOC 18 may include a CPU 22 coupled to an internal bus 36, an internal I/O module 30 coupled to the internal bus 36, etc. The internal I/O module 30 may also be coupled to the die 32.

Although the die 32 and/or the SOC 18 may be fully tested before packaging in the IC chip 10, faults within the IC chip 10, the die 32 and/or the SOC 18 may develop during or after the packaging process. For example, thermal stress or molding pressure during the packaging process may damage one or more components within the IC chip 10. As a result, it may be necessary to test the IC chip 10 after the packaging of the IC chip 10 is complete.

There may be several challenges in testing various components of the IC chip 10 once the packaging of the IC chip 10 is complete. For example, one or more of the die 32's address, data and control signals (or any other suitable types of signals) may not be directly accessible through the I/O pins 38. Additionally, the interface between the SOC 18 and the die 32 (e.g., through the internal I/O module 30) may also not be directly accessible through the I/O pins 38. These factors may prevent any external tester (e.g., an external automated test equipment (ATE)) that is external to the IC chip 10 to apply test patterns to all components of the IC chip 10 (including the die 32) and fully test the IC chip 10. Moreover, the SOC 18 (or one or more components included in the SOC 18, e.g., a memory controller (not illustrated in FIG. 1)) may not be equipped to support advanced and complicated tests, including generation of complicated test patterns, to fully test various components of the die 32.

SUMMARY

In various embodiments, the present invention provides an apparatus and a method for testing an IC chip. More specifically, there is provided, in accordance with various embodiments of the present invention, an integrated circuit (IC) chip comprising a die, a system on chip (SOC) coupled to the die, and an internal test engine included in the SOC and configured to test the die. One or more components within the IC chip may be configured to be tested by an external test engine coupled to the IC chip. One or more components included in the SOC may be configured to be tested by the external test engine. The internal test engine may be configured to test the die concurrently with the testing of the one or more components within the IC chip by the external test engine. The die may be a known good die. The die may be a memory die.

In various embodiments, the internal test engine may be configured to download one or more test patterns from a device external to the IC chip. The internal test engine may be configured to transmit a result of testing the die to a central processing unit (CPU) included in the SOC. The CPU may be configured to repair the die responsive at least in part to the test result received from the internal test engine. The internal test engine may be configured to transmit a result of testing the die to a test controller external to the IC chip. The IC chip may be a multi-chip module (MCM) or a system-in-a-package (SiP).

There is provided, in accordance with various embodiments of the present invention, a method comprising testing a die included in an IC chip using an internal test engine included in a system on chip (SOC) within the IC chip, and transmitting a result of the testing to a central processing unit (CPU) included in the SOC. The method may further comprise testing one or more components included in the SOC using an external test engine coupled to the IC chip. The testing of the die using the internal test engine and the testing of the one or more components using the external test engine may be performed substantially concurrently. The die may be a known good die. The method may further comprise downloading one or more test patterns from a device external to the IC chip. The method may further comprise repairing the die responsive at least in part to receiving the result of the testing.

There is provided, in accordance with various embodiments of the present invention, a system comprising an integrated circuit (IC) chip comprising a die, a system on chip (SOC) coupled to the die, and an internal test engine included in the SOC and configured to test the die; and an external test engine coupled to the IC chip. The external test engine may be configured to test one or more components included in the SOC. The internal test engine may be configured to test the die substantially concurrently with the testing by the external test engine of the one or more components included in the SOC.

BRIEF DESCRIPTION OF THE DRAWINGS

Embodiments of the present invention will be readily understood by the following detailed description in conjunction with the accompanying drawings. To facilitate this description, like reference numerals designate like structural elements. Embodiments of the invention are illustrated by way of example and not by way of limitation in the figures of the accompanying drawings.

FIG. 3 illustrates exemplary micro-program commands to generate test patterns for testing a known good die (KGD) included in the IC chip of FIG. 2, in accordance with various embodiments of the present invention;

DETAILED DESCRIPTION OF EMBODIMENTS OF THE INVENTION

In the following detailed description, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

Various operations may be described as multiple discrete operations in turn, in a manner that may be helpful in understanding embodiments of the present invention; however, the order of description should not be construed to imply that these operations are order dependent.

The description may use the phrases "in an embodiment," or "in embodiments," which may each refer to one or more of the same or different embodiments. The phrase "in some embodiments" is used repeatedly. The phrase generally does not refer to the same embodiments; however, it may. The terms "comprising," "having," and "including" are synonymous, unless the context dictates otherwise. The phrase "A and/or B" means (A), (B), or (A and B). The phrase "A/B" means (A), (B), or (A and B), similar to the phrase "A and/or B." The phrase "at least one of A, B and C" means (A), (B), (C), (A and B), (A and C), (B and C) or (A, B and C). The phrase "(A) B" means (B) or (A and B), that is, A is optional.

Figure 1:
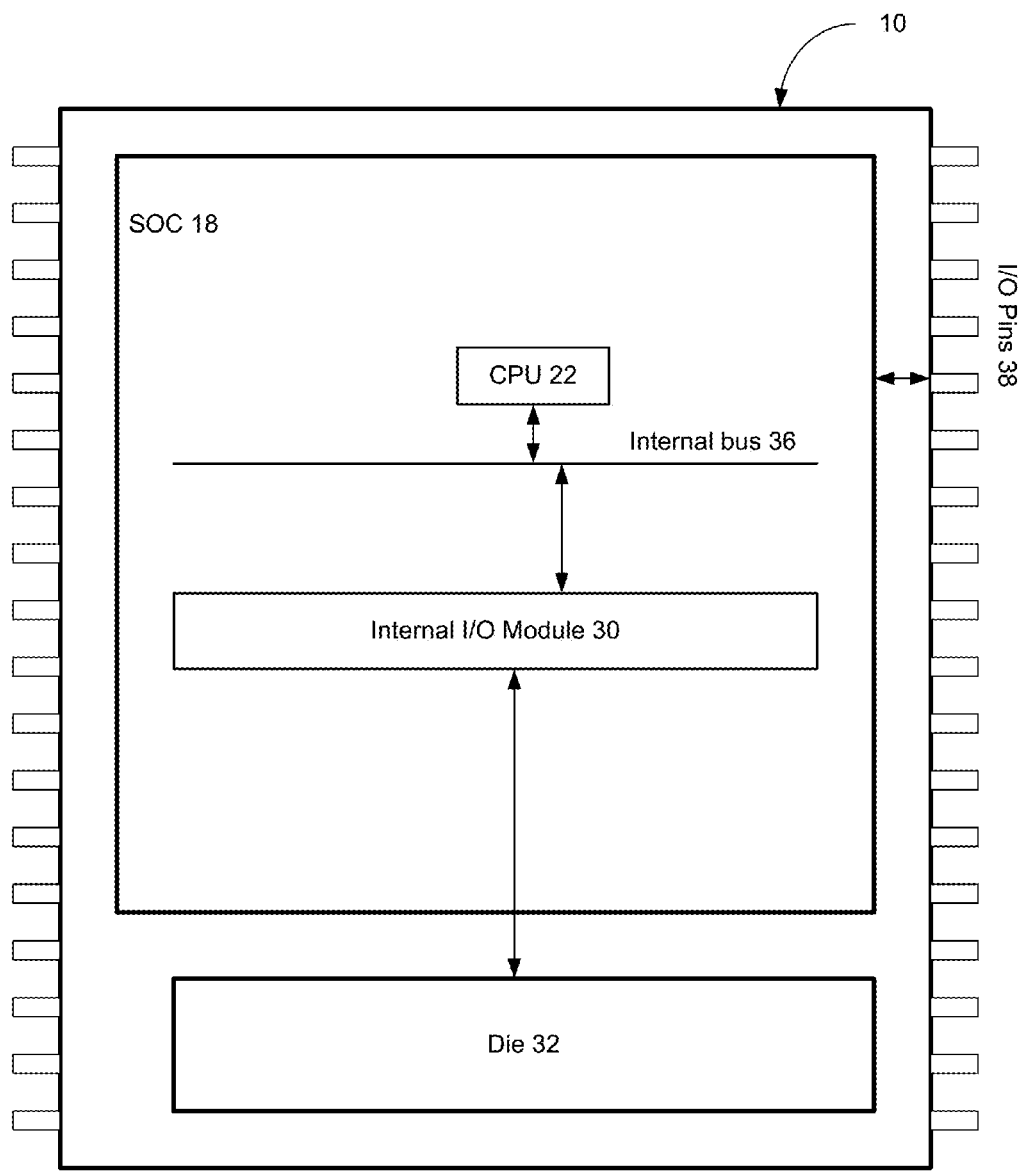
FIG. 1 illustrates an IC chip that includes a plurality of unpackaged integrated circuits (e.g., bare dies), semiconductor dies and/or other modules.
Figure 2:
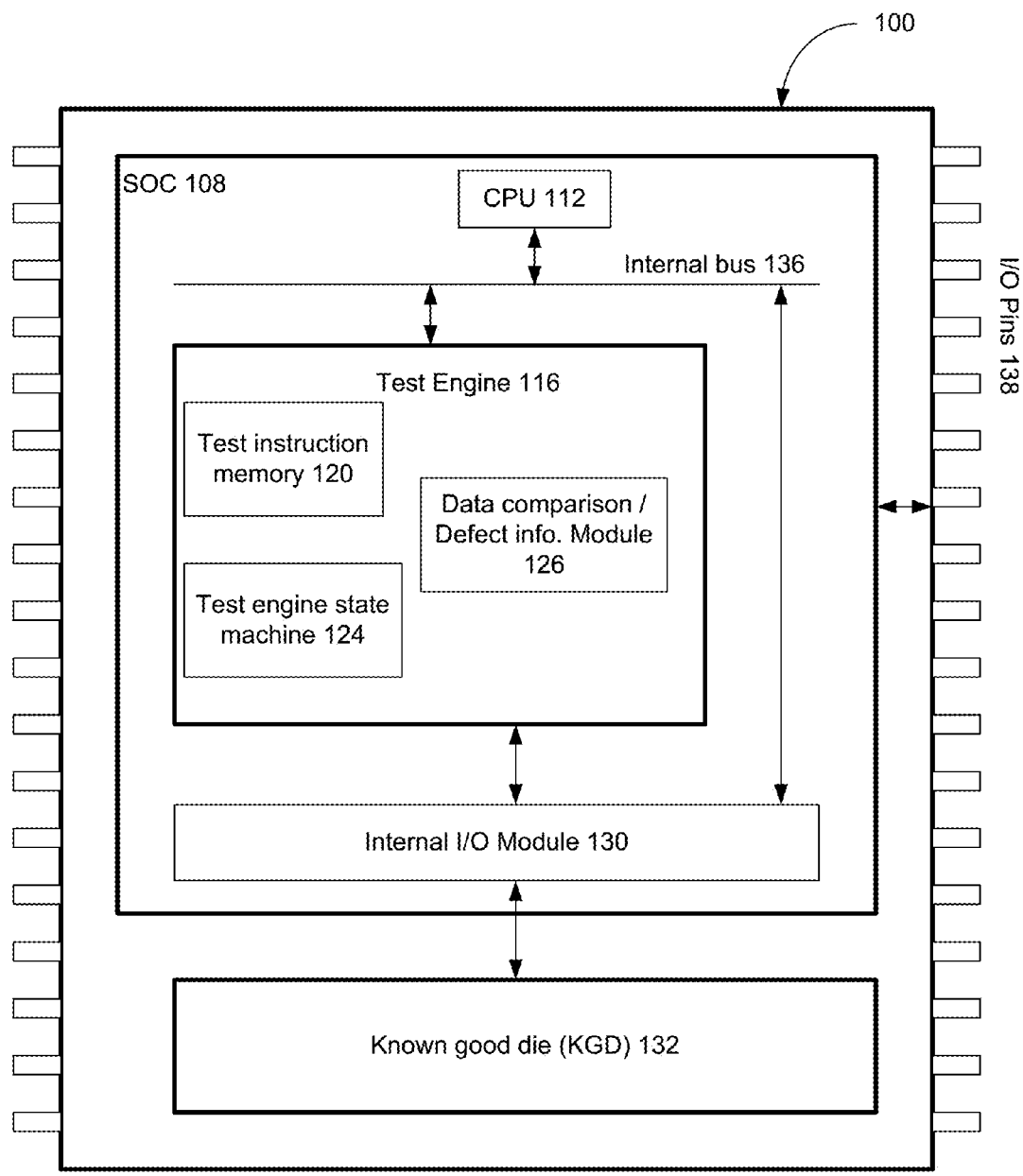
FIG. 2 illustrates an exemplary IC chip including an internal test engine, in accordance with various embodiments of the present invention.

FIG. 2 illustrates an exemplary IC chip 100 including an internal test engine 116, in accordance with various embodiments of the present invention. In various embodiments, the IC chip 100 may be an SiP, an MCM, or any other suitable type of IC chip that may be packaged to include a plurality of unpackaged bare ICs.

In various embodiments, the IC chip 100 may include an SOC 108 and a known good die (KGD) 132. A KGD may be a bare unpackaged IC die that has been fully tested, before packaging in an IC chip (e.g., chip 100), and found to be satisfactory. The SOC 108 and the KGD 132 may be utilized for a variety of purposes. For example, in various embodiments, the KGD 132 may be a memory chip (e.g., a double data rate synchronous dynamic random access memory (DDR SDRAM)) and the SOC 108 may include, among other components, a memory controller (not illustrated in FIG. 2). The IC chip 100 may also include a plurality of general purpose input/output (I/O) pins 138.

In various embodiments, the SOC 108 may include a plurality of components, as is known to those skilled in the art. For example, the SOC may include a CPU 112 coupled to an internal bus 136, an internal I/O module 130 coupled to the internal bus 136, etc. The internal I/O module 130 may also be coupled to the KGD 132, and form an interface between the KGD 132 and various components within the SOC 108.

In various embodiments, the SOC 108 may also include an internal test engine 116. The test engine 116 may include a test instruction memory 120 configured to store instructions to carry out testing by the test engine 116. The test engine 116 may also include a test engine state machine 124 and a data comparison/defect information module 126. The test engine 116 may also include many other components not illustrated in FIG. 2, e.g., a test engine controller, a test engine I/O module, etc.

In various embodiments, the test engine 116 may be configured to test the KGD 132, and/or the interface between the KGD 132 and other components of the IC chip 100 (e.g., the interface between the KGD 132 and the internal I/O module 132). As previously discussed, the KGD 132 may be a memory die (e.g., a DDR memory), and in various embodiments, the test engine 132 may test interface transactions of the KGD 132 at a memory command level (e.g., a DDR command level). This low level of programming may permit the test engine 132 to drive any memory command (e.g., DDR command) combination (or any other test pattern) to test the KGD 132.

FIG. 3 illustrates exemplary micro-program commands to generate test patterns for testing the KGD 132 of FIG. 2, in accordance with various embodiments of the present invention. These test commands may be stored in the test instruction memory 120, and the test engine state machine 124 or a test controller (not illustrated in FIG. 2) included in the test engine 116 may use one or more of these commands to generate the test patterns. In various embodiments, if the KGD 132 is a memory die (e.g., a DDR memory), these commands may be used to generate bit level test patterns to test the memory KGD 132.

Referring again to FIG. 2, in various embodiments, the test engine instructions may be programmed on a cycle-by-cycle basis, and may provide data and signals needed to test the KGD 132. The data comparison/defect information module 126, included in the test engine 116, may compare an output (in response to applying a test pattern to the KGD 132) from the KGD 132 with an expected output, and detect one or more defects (if any defect is present) based at least in part on the comparison. The results of the testing, including any possible defect information, may be transmitted, by the test engine 116, to the CPU 112.

In various embodiments, the CPU 112 may repair the KGD 132 based at least in part on the test results received from the test engine 132. For example, the KGD 132 may have a redundancy repair design, and the CPU 112 may utilize this redundancy design to identify one or more faulty circuit segments in the KGD 132, repair the faulty circuit segments, and/or use one or more working circuit segments in the KGD 132 in lieu of the faulty circuit segments. For example, if the KGD 132 is a memory die and if one or more failed bits within the memory die 132 is identified during testing of the die 132, the CPU 112 (or any other component within the SOC, e.g., a memory controller (not illustrated in FIG. 2)) may avoid these failed memory bits during subsequent operations.

Figure 4:
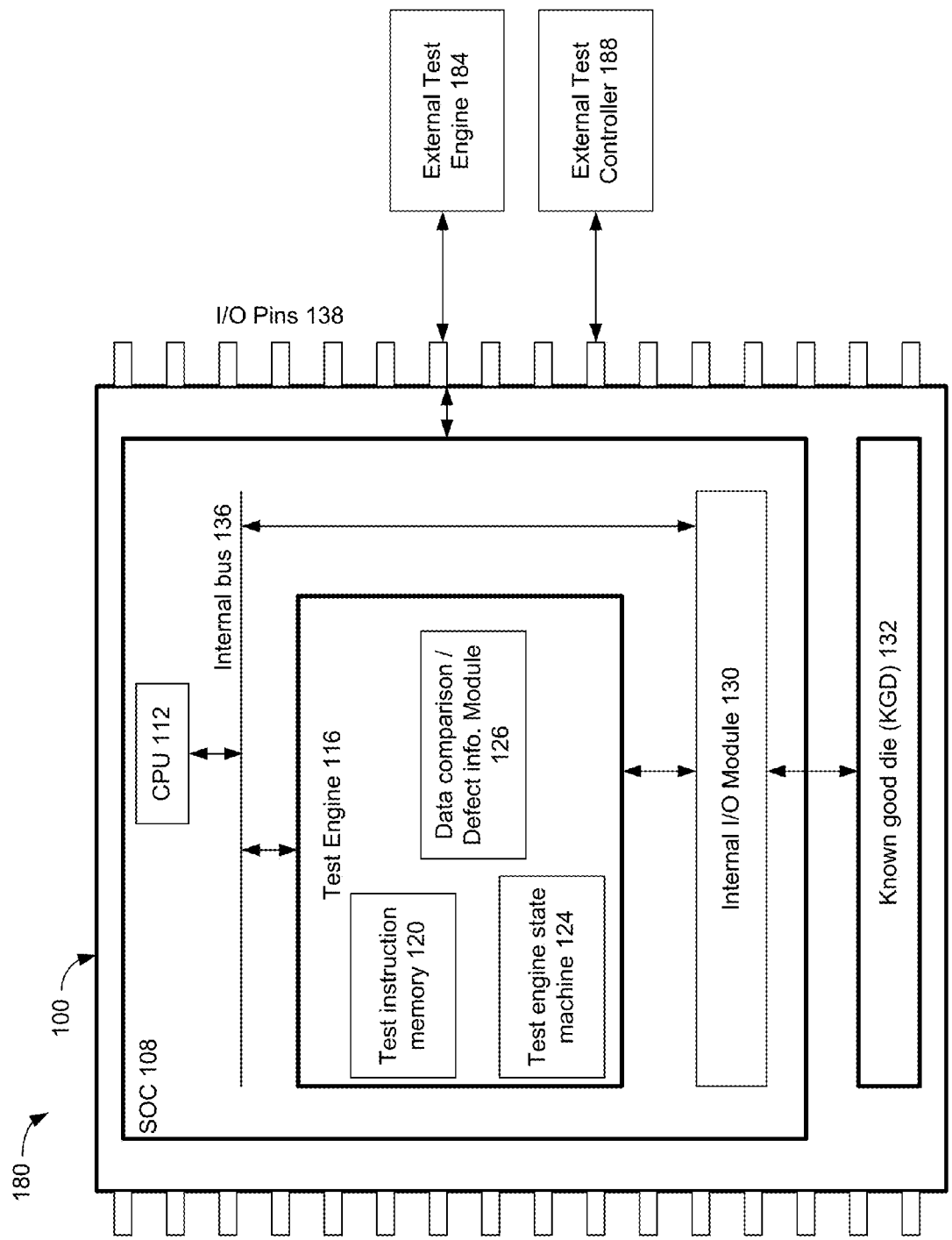
FIG. 4 illustrates an exemplary system including the IC chip of FIG. 2 coupled to an external test engine and an external test controller, in accordance with various embodiments of the present invention.

FIG. 4 illustrates an exemplary system 180 including the IC chip 100 of FIG. 2 coupled to an external test engine 184 and an external test controller 188, in accordance with various embodiments of the present invention. Although the external test engine 184 and the external test controller 188 are illustrated to be coupled to a respective I/O pin of the IC chip 100, each of the external test engine 184 and/or the external test controller 188 may be coupled to more than one I/O pins of the IC chip 100, as will be readily understood by those skilled in the art.

In various embodiments, the external test engine 184 (e.g., an automated test engine (ATE)) may test one or more components within the IC chip 100. For example, the external test engine 184 may be used to test one or more circuits within the SOC 108. In various embodiments, the test engine 116 may concurrently test the KGD 132 while the external test engine 184 tests other components (e.g., one or more logic and analog circuits included in the SOC 108) of the IC chip 100. The concurrent testing by the external test engine 184 and the internal test engine 116 may result in a reduction in total time required to test the IC chip 100.

In various embodiments, the results of the testing performed by the test engine 116, including any possible defect information, may be transmitted, by the test engine 116, to the CPU 112. The test results may also be transmitted to an external device (e.g., the external test controller 188) coupled to the IP chip 100. For example, the IC chip 100 may transmit a pass/no pass test result to the external test controller 188 upon completion of the testing.

In various embodiments, the test engine 116 may also be configured to download one or more test patterns from an external device (e.g., the external test controller 188, an external memory (not illustrated in FIG. 4), etc.) coupled to the IC chip 100. For example, based on the application of the KGD 132, the test engine 116 may download one or more test patterns in the test instruction memory 120 to test the KGD 132.

Figure 5:
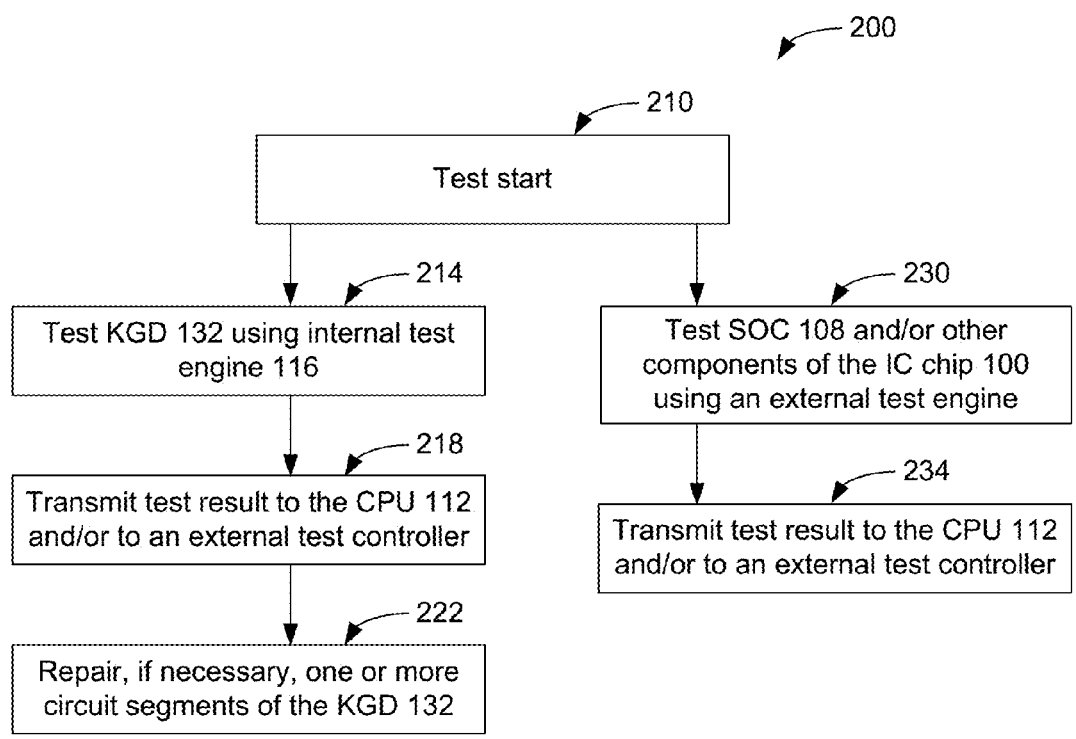
FIG. 5 illustrates an exemplary method for testing the IC chip of FIGS. 2 and 4, in accordance with various embodiments of the present invention.

FIG. 5 illustrates an exemplary method 200 for testing the IC chip 100 of FIGS. 2 and 4, in accordance with various embodiments of the present invention. Referring to FIGS. 2, 4 and 5, at 210, the testing of the IC chip 100 may begin. At 214, the internal test engine 116 may test the KGD 132 (along with optionally testing the interface of the KGD 132 with the SOC 108). At 218, the internal test engine 116 may transmit the test results to the CPU 112 (or to any other components within the SOC 108, e.g., a memory controller) and/or to the external test controller 188. At 222, the CPU 112 may repair one or more faulty circuit segments of the KGD 132 based at least in part on the received test results, as previously discussed.

At 230, the external test engine 184 may test the SOC 108 and/or other components of the IC chip 100. At 234, the external test engine 184 may transmit the test result to the CPU 112 and/or to the external test controller 188. In various embodiments, testing using the internal test engine at 214 and testing using the external test engine 184 at 230 may be performed substantially concurrently.

Although specific embodiments have been illustrated and described herein, it will be appreciated by those of ordinary skill in the art and others, that a wide variety of alternate and/or equivalent implementations may be substituted for the embodiments illustrated and described without departing from the scope of the present invention. This present disclosure covers all methods, apparatus, and articles of manufacture fairly falling within the scope of the appended claims either literally or under the doctrine of equivalents. For example, although the above discloses example systems including, among other components, software or firmware executed on hardware, it should be noted that such systems are merely illustrative and should not be considered as limiting. In particular, it is contemplated that any or all of the disclosed hardware, software, and/or firmware components could be embodied exclusively in hardware, exclusively in software, exclusively in firmware or in some combination of hardware, software, and/or firmware. This application is intended to cover any adaptations or variations of the embodiments discussed herein. Therefore, it is manifested and intended that the invention be limited only by the claims and the equivalents thereof.

What is claimed is:

1. A system comprising:
a die;
a system on chip coupled to the die via an interface, the system on chip comprising (i) one or more components and (ii) a first test engine; and
a second test engine that is external to (i) the system on chip and (ii) the die,
wherein the first test engine (i) is internal to the system on chip and (ii) is distinct from the one or more components,
wherein the first test engine includes a test instruction memory configured to store test instructions,
wherein the test instructions are configured to be executed by the first test engine to test the interface that couples the die and the system on chip, and
wherein the second test engine is configured to test the one or more components.

2. The system of claim 1, wherein the first test engine is configured to test the interface concurrently with the testing of the one or more components by the second test engine.

3. The system of claim 1, wherein the test instructions are further configured to be executed by the first test engine to test the die.

4. The system of claim 1, wherein the die is a known good die.

5. The system of claim 1, wherein the die is a memory die.

6. The system of claim 1, wherein the first test engine is configured to download one or more test patterns from a device external to the integrated circuit chip.

7. The system of claim 1, wherein the first test engine is configured to transmit a test result of testing the interface to a central processing unit included in the system on chip.

8. The system of claim 7, wherein the central processing unit is configured to repair the interface responsive at least in part to the test result received from the first test engine.

9. The system of claim 1, wherein the first test engine is configured to transmit a result of testing the interface to a test controller external to the integrated circuit chip.

10. The system of claim 1, wherein the integrated circuit chip is a multi-chip module or a system-in-a-package.

11. A method of testing an interface coupling a die to a system on chip, wherein the (i) die, (ii) the interface, and (iii) the system on chip are included within an integrated circuit chip, wherein the system on chip includes (i) one or more components and (ii) a first test engine, wherein the first test engine (i) is internal to the system on chip and (ii) is distinct from the one or more components, wherein the first test engine includes a test instruction memory that stores test instructions, and wherein the method comprises:

executing, by the first test engine, the test instructions stored in the test instruction memory to test the interface;

transmitting a result of the testing of the die to a central processing unit included in the system on chip; and configuring the one or more components to be tested by a second test engine that is external to the integrated circuit chip.

12. The method of claim 11, wherein executing the test instructions further comprises executing the test instructions such that the interface is tested by the first test engine concurrently with the testing of the one or more components by the second test engine.

13. The method of claim 11, further comprising:
executing, by the first test engine, the test instructions stored in the test instruction memory to test the die.

14. The method of claim 11, wherein the die is a known good die.

15. The method of claim 11, further comprising:
downloading one or more test patterns from a device external to the integrated circuit chip.

16. The method of claim 11, further comprising:
repairing the interface responsive at least in part to receiving the result of the testing of the die.

17. The method of claim 11, further comprising:
transmitting the result of testing the interface to a test controller external to the integrated circuit chip.

18. A system comprising:
an integrated circuit chip including
 (A) a die, and
 (B) a system on chip that is coupled to the die via an interface, the system on chip comprising (i) one or more components and (ii) a first test engine, wherein the first test engine (i) is internal to the system on chip and (ii) is distinct from the one or more components, wherein the first test engine includes a test instruction memory, wherein test instructions are tangibly stored on the test instruction memory, and wherein the test instructions are executable by the first test engine to enable the first test engine to
  test the interface coupling the die with the system on chip, and
 transmit a result of the testing of the interface to a central processing unit included in the system on chip; and
a second test engine that is (i) external to the integrated circuit chip and (ii) configured to test the one or more components included in the system on chip.

19. The system of claim 18, wherein the test instructions are executable by the first test engine to further enable the first test engine to:
transmit the result of testing the interface to a test controller external to the integrated circuit chip.

20. The system of claim 18, wherein the test instructions are executable by the first test engine to further enable the first test engine to:
downloading one or more test patterns from a device external to the integrated circuit chip.

21. The system of claim 1, wherein:
the die and the system on chip is included in an integrated circuit chip; and
the second test engine is external to the integrated circuit chip.

* * * * *